United States Patent
Lanka et al.

(10) Patent No.: US 12,347,818 B2
(45) Date of Patent: Jul. 1, 2025

(54) LOGIC DIE IN A MULTI-CHIP PACKAGE HAVING A CONFIGURABLE PHYSICAL INTERFACE TO ON-PACKAGE MEMORY

(71) Applicant: Intel Corporation, Santa Clara, CA (US)

(72) Inventors: Narasimha Lanka, Dublin, CA (US); Lohit Yerva, Mountain View, CA (US); Mohammad Rashid, San Jose, CA (US); Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 862 days.

(21) Appl. No.: 17/213,791

(22) Filed: Mar. 26, 2021

(65) Prior Publication Data

US 2021/0225827 A1     Jul. 22, 2021

(51) Int. Cl.
*H01L 25/18* (2023.01)
*H01L 23/538* (2006.01)
*H01L 25/065* (2023.01)

(52) U.S. Cl.
CPC .......... *H01L 25/18* (2013.01); *H01L 23/5381* (2013.01); *H01L 23/5384* (2013.01); *H01L 23/5385* (2013.01); *H01L 25/0652* (2013.01); H01L 2225/06513 (2013.01); H01L 2225/06517 (2013.01); H01L 2225/0652 (2013.01)

(58) Field of Classification Search
CPC ..... H01L 24/16; H01L 25/18; H01L 25/0652; H01L 23/5381; H01L 23/5383; H01L 23/5385

See application file for complete search history.

(56) References Cited

U.S. PATENT DOCUMENTS

| | | | |
|---|---|---|---|
| 2018/0366442 A1* | 12/2018 | Gu | H01L 25/0657 |
| 2019/0050325 A1* | 2/2019 | Malladi | G06F 12/0862 |
| 2019/0158096 A1* | 5/2019 | Tang | H01L 24/16 |
| 2019/0179785 A1* | 6/2019 | Keeth | H01L 23/5385 |
| 2021/0104466 A1* | 4/2021 | Matsumoto | H01L 23/5383 |
| 2023/0326905 A1* | 10/2023 | Niu | H01L 24/16 257/777 |

OTHER PUBLICATIONS

"High Bandwidth Memory (HBM2) Interface Intel FPGA IP User Guide", Updated for Intel® Quartus® Prime Design Suite: 20.4, IP Version: 19.6.1, UG-20031, Dec. 14, 2020, 97 pages.

\* cited by examiner

*Primary Examiner* — Zandra V Smith
*Assistant Examiner* — John M Parker
(74) *Attorney, Agent, or Firm* — Compass IP Law PC

(57) ABSTRACT

A multi-chip device having a configurable physical interface in a logic die to on-package memory is provided. The configurable physical interface to allow a connection from a signal on the memory interface to be selected based on whether the logic die is mirrored or non-mirrored.

18 Claims, 12 Drawing Sheets

| 502 | Upper Right Power Supply Region | | |
|---|---|---|---|
| DWORD0 Channel m | DWORD0 Channel i | DWORD0 Channel e | DWORD0 Channel a |
| AWORD Channel m | AWORD Channel i | AWORD Channel e | AWORD Channel a |
| DWORD1 Channel m | DWORD1 Channel i | DWORD1 Channel e | DWORD1 Channel a |
| DWORD0 Channel n | DWORD0 Channel j | DWORD0 Channel f | DWORD0 Channel b |
| AWORD Channel n | AWORD Channel j | AWORD Channel f | AWORD Channel b |
| DWORD1 Channel n | DWORD1 Channel j | DWORD1 Channel f | DWORD1 Channel b |
| 506 | Reset, IEEE1500 Port, Temperature, etc | | |
| DWORD1 Channel o | DWORD1 Channel k | DWORD1 Channel g | DWORD1 Channel c |
| AWORD Channel o | AWORD Channel k | AWORD Channel g | AWORD Channel c |
| DWORD0 Channel o | DWORD0 Channel k | DWORD0 Channel g | DWORD0 Channel c |
| DWORD1 Channel p | DWORD1 Channel l | DWORD1 Channel h | DWORD1 Channel d |
| AWORD Channel p | AWORD Channel l | AWORD Channel h | AWORD Channel d |
| DWORD0 Channel p | DWORD0 Channel l | DWORD0 Channel h | DWORD0 Channel d |
| 504 | Lower Right Power Supply Region | | |

| Channel Mapping | | | |
| --- | --- | --- | --- |
| Non-Mirror | | Mirror | |
| HBM Channel | SOC channel | HBM Channel | SOC channel |
| A | A | A | D |
| B | B | B | C |
| C | C | C | B |
| D | D | D | A |
| E | E | E | H |
| F | F | F | G |
| G | G | G | F |
| H | H | H | E |
| I | I | I | L |
| J | J | J | K |
| K | K | K | J |
| L | L | L | I |
| M | M | M | P |
| N | N | N | O |
| O | O | O | N |
| P | P | P | M |

FIG. 6

| VSS | | VDDQ | | VSS |
|---|---|---|---|---|
| | BUMP1 | | BUMP15 | |
| VSS | | VDDQ | | VSS |
| | BUMP2 | | BUMP16 | |
| VSS | | VDDQ | | VSS |
| | BUMP3 | | BUMP17 | |
| VSS | | VDDQ | | VSS |
| | BUMP4 | | BUMP18 | |
| VSS | | VDDQ | | VSS |
| | BUMP5 | | BUMP19 | |
| VSS | | VDDQ | | VSS |
| | BUMP6 | | BUMP20 | |
| VSS | | VDDQ | | VSS |
| | BUMP7 | | BUMP21 | |
| VSS | | VDDQ | | VSS |
| | BUMP8 | | BUMP22 | |
| VSS | | VDDQ | | VSS |
| | BUMP9 | | BUMP23 | |
| VSS | | VDDQ | | VSS |
| | BUMP10 | | BUMP24 | |
| VSS | | VDDQ | | VSS |
| | BUMP11 | | BUMP25 | |
| VSS | | VDDQ | | VSS |
| | BUMP12 | | BUMP26 | |
| VSS | | VDDQ | | VSS |
| | BUMP13 | | BUMP27 | |
| VSS | | VDDQ | | VSS |
| | BUMP14 | | BUMP28 | |

| Pseudo Channel Mapping | | | |
|---|---|---|---|
| Non-Mirror | | Mirror | |
| HBM Channel | SOC channel | HBM Channel | SOC channel |
| A0 | A0 | A0 | D0 |
| A1 | A1 | A1 | D1 |
| B0 | B0 | B0 | C0 |
| B1 | B1 | B1 | C1 |
| C0 | C0 | C0 | B0 |
| C1 | C1 | C1 | B1 |
| D0 | D0 | D0 | A0 |
| D1 | D1 | D1 | A1 |
| E0 | E0 | E0 | H0 |
| E1 | E1 | E1 | H1 |
| F0 | F0 | F0 | G0 |
| F1 | F1 | F1 | G1 |
| G0 | G0 | G0 | F0 |
| G1 | G1 | G1 | F1 |
| H0 | H0 | H0 | E0 |
| H1 | H1 | H1 | E1 |
| I0 | I0 | I0 | L0 |
| I1 | I1 | I1 | L1 |
| J0 | J0 | J0 | K0 |
| J1 | J1 | J1 | K1 |
| K0 | K0 | K0 | J0 |
| K1 | K1 | K1 | J1 |
| L0 | L0 | L0 | I0 |
| L1 | L1 | L1 | I1 |
| M0 | M0 | M0 | P0 |
| M1 | M1 | M1 | P1 |
| N0 | N0 | N0 | O0 |
| N1 | N1 | N1 | O1 |
| O0 | O0 | O0 | N0 |
| O1 | O1 | O1 | N1 |
| P0 | P0 | P0 | M0 |
| P1 | P1 | P1 | M1 |

FIG. 10A

| HBM Channel-A | SOC Channel-D | HBM Channel-E | SOC Channel-H |
|---|---|---|---|
| DBIa0 | xxDBId[15] | DBIe0 | xxDBIh[15] |
| RDa0 | xxRDd[7] | RDe0 | xxRDh[7] |
| PARa0 | xxPARd3 | PARe0 | xxPARh3 |
| DMa0 | xxDMd[15] | DMe0 | xxDMh[15] |
| DBIa1 | xxDBId[14] | DBIe1 | xxDBIh[14] |
| WDQSa0_c | xxWDQSd3_c | WDQSe0_c | xxWDQSh3_c |
| WDQSa0_t | xxWDQSd3_t | WDQSe0_t | xxWDQSh3_t |
| DMa1 | xxDMd[14] | DMe1 | xxDMh[14] |
| DBIa2 | xxDBId[13] | DBIe2 | xxDBIh[13] |
| RDQSa0_c | xxRDQSd3_c | RDQSe0_c | xxRDQSh3_c |
| RDQSa0_t | xxRDQSd3_t | RDQSe0_t | xxRDQSh3_t |
| DMa2 | xxDMd[13] | DMe2 | xxDMh[13] |
| DBIa3 | xxDBId[12] | DBIe3 | xxDBIh[12] |
| RDa1 | xxRDd[6] | RDe1 | xxRDh[6] |
| DERRa0 | xxDERRd3 | DERRe0 | xxDERRh3 |
| DMa3 | xxDMd[12] | DMe3 | xxDMh[12] |

FIG. 10B

LOGIC DIE IN A MULTI-CHIP PACKAGE HAVING A CONFIGURABLE PHYSICAL INTERFACE TO ON-PACKAGE MEMORY

FIELD

This disclosure relates to a multi-chip package and in particular to a configurable physical interface in a logic die to on-package memory in the multi-chip package.

BACKGROUND

Yield improvement is a critical issue in advanced technology nodes. A technology node (also referred to as a process node, process technology or node) refers to a specific semiconductor manufacturing process and its design rules. technology nodes such as 22 nano meters (nm), 16 nm, 14 nm, and 10 nm refer to a specific generation of chips made in a particular technology.

Typically, integrated circuits are produced on a single wafer. The wafer is diced into dies (also referred to as tiles). Die splitting to a technique used to make tiles smaller and "stitched" together through on-package interfaces thereby increasing the yield of a System on Chip.

BRIEF DESCRIPTION OF THE DRAWINGS

Features of embodiments of the claimed subject matter will become apparent as the following detailed description proceeds, and upon reference to the drawings, in which like numerals depict like parts, and in which:

FIG. 5 illustrates regions in the bump matrix for a HBM3 die;

FIG. 6 is a table illustrating the mapping of channels between the HBM3 die and the SoC die (non-mirrored and mirrored);

FIG. 7 illustrates a bump matrix for the mid-stack region of the SoC die that includes a single bump for each signal.

FIG. 9A illustrates a pseudo channel (A-H) bump matrix for a master SoC die and a master HBM2 die;

FIG. 9B illustrates a pseudo channel (A-H) bump matrix for a mirrored SoC tile and the master HBM2 die;

FIG. 10A is a table illustrating the mapping of pseudo channels between the HBM2 die and the SoC die (non-mirrored and mirrored);

FIG. 10B is a table that illustrates a subset of special signals from the mirrored SoC die to the HBM2 die.

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined as set forth in the accompanying claims.

DESCRIPTION OF EMBODIMENTS

One example of an on package memory die is High Bandwidth Memory (HBM) that may be compatible with HBM (HBM, JESD235, originally published by JEDEC (Joint Electronic Device Engineering Council) in October 2013), HBM2 (HBM version 2, JESD235C, originally published by JEDEC in January 2020), or HBM3 (HBM version 3 currently in discussion by JEDEC).

A multi-chip package can include the on package memory tile and a logic die. The logic die can be a System on Chip (SoC), a Field Programmable Gate Array (FPGA) Central Processing Unit (CPU) or a Graphics Processing Unit (GPU). With an on package memory device such as High Bandwidth Memory (HBM), mirroring flips the HBM interface Input/Output (I/O) pins on the logic die while the memory tile can only be rotated. This results in a mismatch between the order of HBM I/O pins on the logic die and order of the HBM I/O pins on the on package memory tile.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Figure 1A:
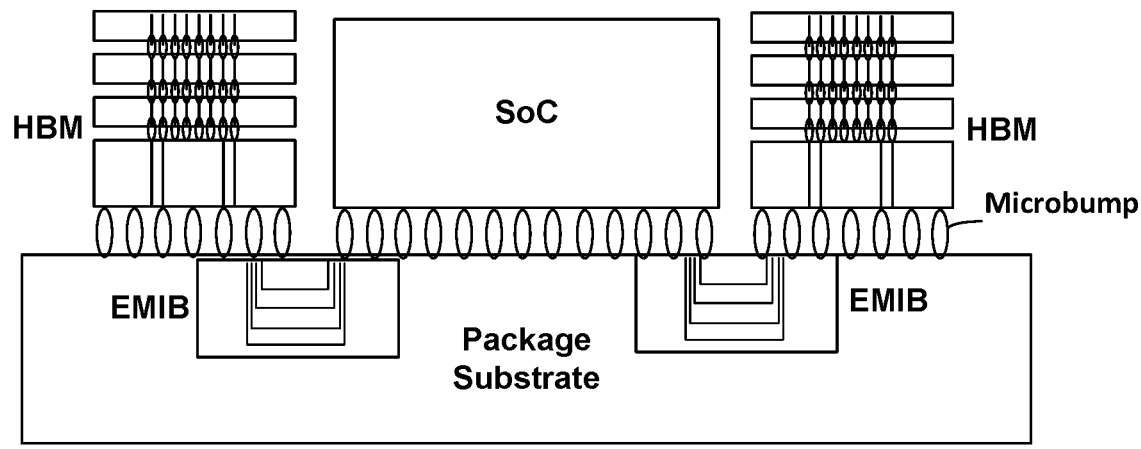
FIG. 1A is a block diagram of a multi-chip package that includes a System on Chip (SoC), High Bandwidth Memory (HBM) and Embedded Multi-die Interconnect Bridge (EMIB)

FIG. 1A is a block diagram of a multi-chip package that includes a SoC, HBM and EMIB. A plurality of bumps (also referred to as solder bump, microbumps, or ball) provide contact between I/O pins on the SoC and I/O pins on the HBM to the package substrate. The EMIB is embedded in the package substrate below the edges of the SoC die and the HBM die and includes routing layers to connect I/O pins from the SoC die to I/O pins on the HBM die via the micro-bumps on the SoC die and the HBM die.

Figure 1B:
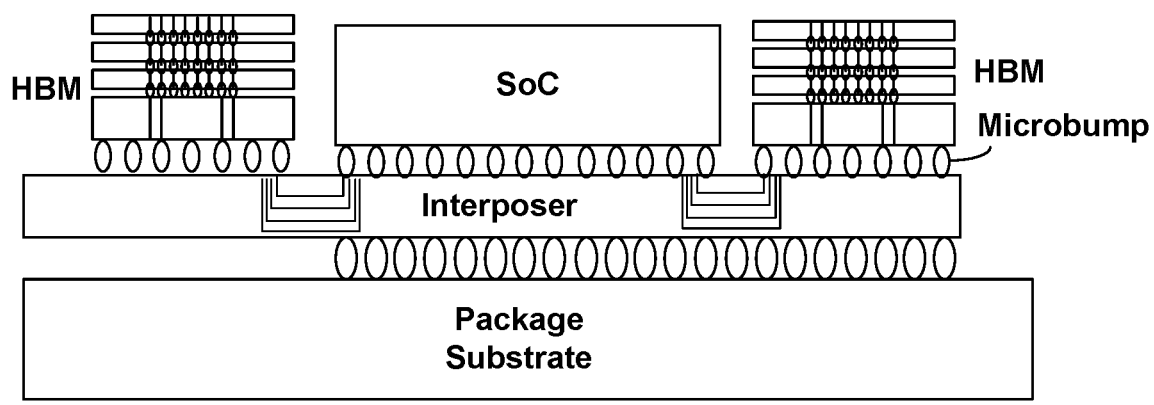
FIG. 1B is a block diagram of a multi-chip package that includes a SoC, HBM and interposer.

FIG. 1B is a block diagram of a multi-chip package that includes a SoC, HBM and interposer. A plurality of -bumps provide contact between I/O pins on the SoC and I/O pins on the HBM to the interposer. The SoC die and HBM die are placed side by side on top of an interposer that includes through-silicon vias (TSVs). The interposer acts as a bridge between the SoC die and HBM die and a printed circuit board (PCB).

Figure 2:
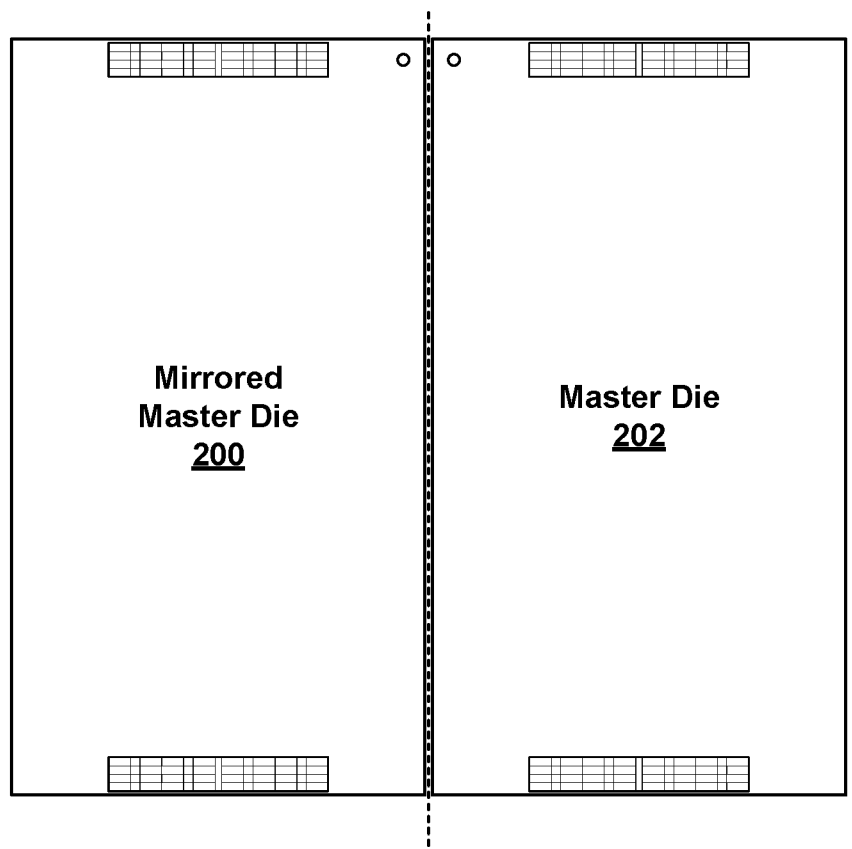
FIG. 2 illustrates one example of a tiling architecture used in a multi-chip package.

FIG. 2 illustrates one example of a tiling architecture used in a multi-chip package. The two-tile architecture shown in FIG. 2 includes a master die 202 and a mirrored master die 200.

Figure 3:
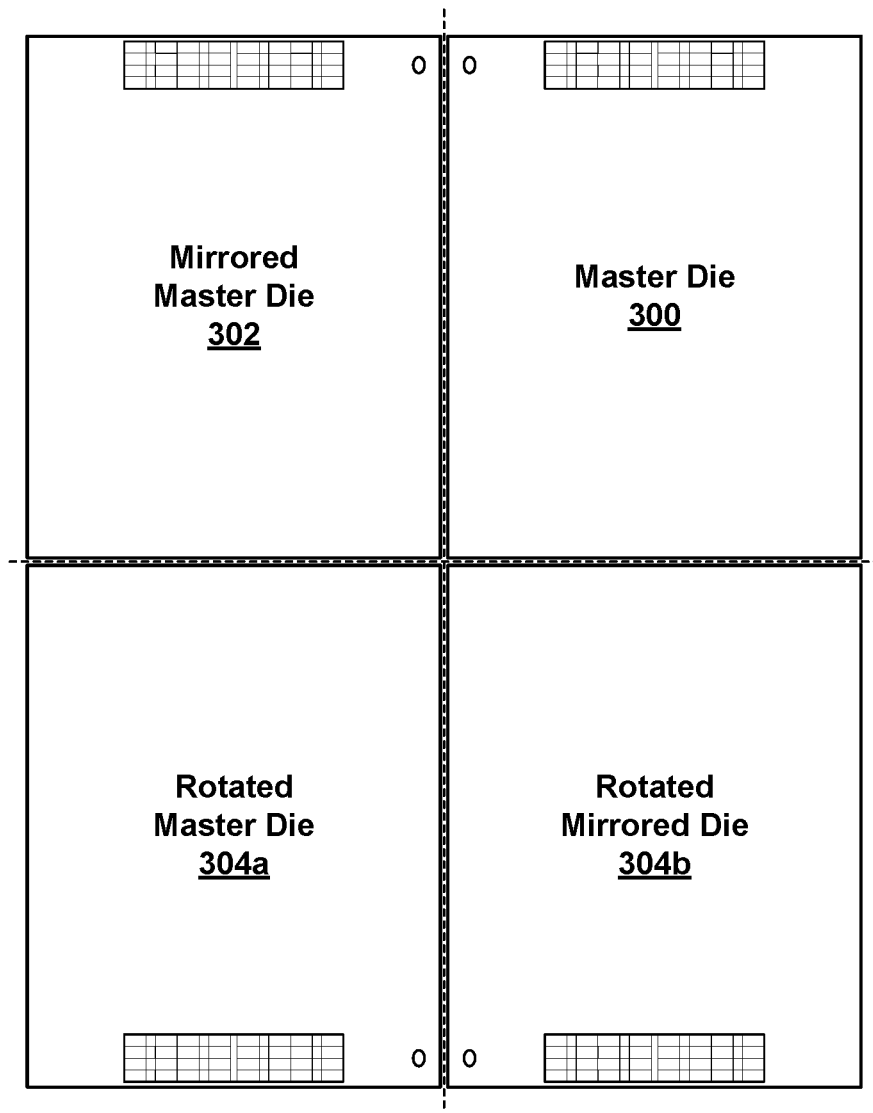
FIG. 3 illustrates another example of a tiling architecture used in a multi-chip package.

FIG. 3 illustrates another example of a tiling architecture used in a multi-chip package. The four-tile architecture shown in FIG. 3 is constructed by mirroring and rotating the master die and includes a master die 300, a mirrored master die 302 and two rotated master dies 304a, 304b.

Figure 4A:
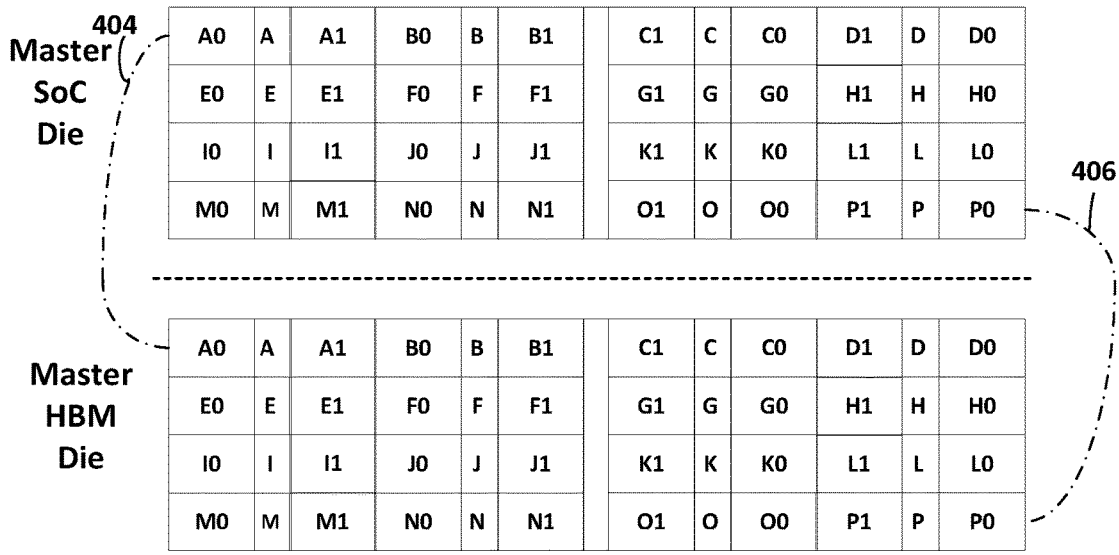
FIG. 4A illustrates a channel (A-P) bump matrix for a master SoC die and a master HBM3 die.

A bump matrix for a HBM3 die is defined as part of the JEDEC specification. FIG. 4A illustrates a channel (A-P) bump matrix for a master SoC die and a master HBM3 die. As shown in FIG. 4A, the port order between the master SoC die and the master HBM3 die is the same. For example, A0 bump for channel A 404 are in the same position in both the master SoC die and the master HBM3 die and P0 bump 406 for channel P are in the same position in both the master SoC die and the master HBM3 die.

Figure 4B:
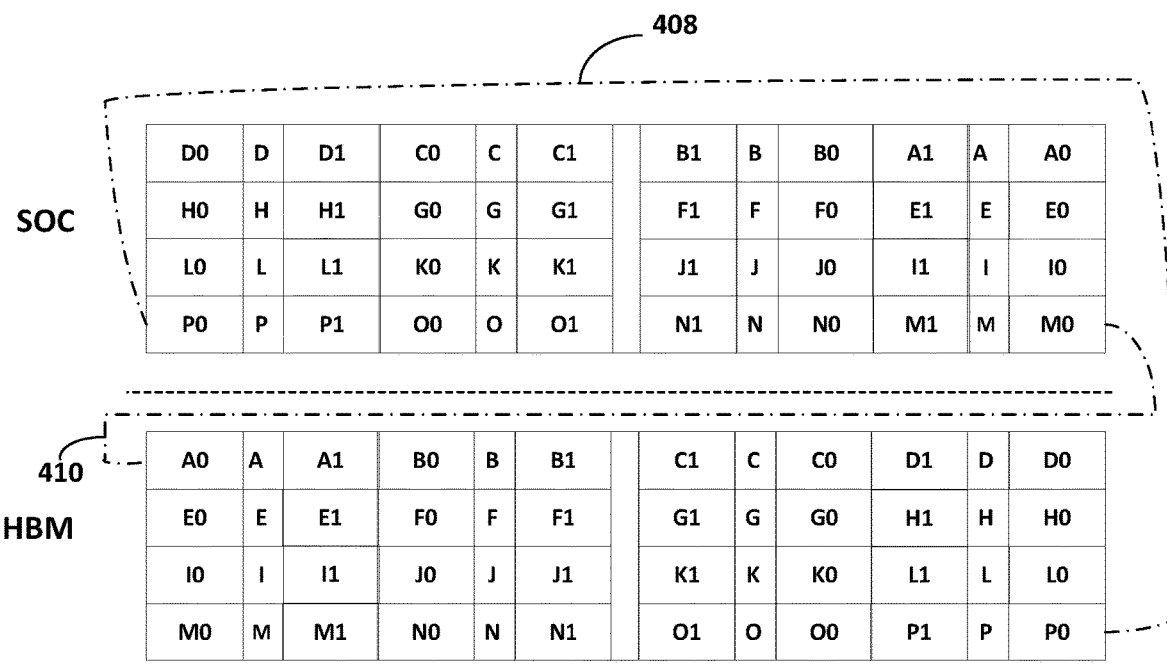
FIG. 4B illustrates a channel (A-P) bump matrix for a mirrored SoC die and a master HBM3 die.

FIG. 4B illustrates a channel (A-P) bump matrix for a mirrored SoC die and a channel (A-P) bump matrix for a master HBM die. When the die is mirrored, the port order between the HBM die and the mirrored SoC die is changed. As shown in FIG. 4B, the channel order in the bump matrix (channel bump field) in the mirrored SoC die and the master HBM die are not the same. For example, A0 bump for channel A 410 are in different positions in the channel bump field for the mirrored SoC die and the master HBM die and P0 bump 408 for channel P are in different positions in the channel bump field for the mirrored SoC die and the channel bump field for master HBM die. To minimize routing complexity, the channel order in the channel bump fields should be similar on both dies.

FIG. 5 illustrates regions in the bump matrix for a HBM3 die. The bump matrix includes an upper right power supply region 502, a lower right power supply region 504, a mid-stack region 506 and two channel regions 508, 510. The bump matrix is symmetric (mirror image) around the mid-stack region 506.

There are sixteen channels that are labeled a-p. Each channel includes bumps for DWORD0, DWORD1 and AWORD. DWORD0 and DWORD1 correspond to data (DQ) signals, for example DWORD0 corresponds to DQ [31:0] for pseudo channel 0 and DWORD 1 corresponds to DQ [63:0] for pseudo channel 1. AWORD corresponds to row and column address signals, for examples, R[a][9:0] and C[a][9:0]. As each of the sixteen channels are fully independent, each channel on the SoC die does not need to be connected to the corresponding channel on the HBM3 die. Thus, bumps for channel A on the HBM3 die are connected directly to channel D on the mirrored SoC die and bumps for channel D on the HBM3 die are connected directly to channel A on the mirrored SoC die.

FIG. 6 is a table illustrating the mapping of channels between the HBM3 die and the SoC die (non-mirrored and mirrored). As the channels are fully independent, the channel order can be different in the mirrored SoC die. As the bump matrix is symmetric around the mid-stack region 506, the pseudo-channel (PC) mapping is the same for both the mirrored SoC die and the non-mirrored SoC die, that is PC(0) is connected to PC(0) in both mirrored and non-mirrored SoC dies.

Returning to FIG. 5, the mid-stack region 506 includes IEEE-1500 sideband signals, RESET signals, Temperature Report (TEMP [1:0]) signals and DRAM Catastrophic Temperature Report (CATTRIP) signals. The IEEE-1500 sideband signals include wrapper serial port data out (WSO[a:p]), wrapper serial port clock (WRCK), wrapper serial port reset (WRST_n), wrapper serial port instruction register select (SelectWIR), wrapper serial port shift (ShiftWR), wrapper serial port capture (CaptureWR), and wrapper serial port update (UpdateWR) signals. The mid-stack region 506 includes a non-symmetric bump distribution around the center column with two bumps for some signals to provide redundancy.

FIG. 7 illustrates a bump matrix for the mid-stack region 506 of the SoC die that includes a single bump for each signal. The bumps have generic names (labeled Bump1 to Bump27) to signify that they are reconfigurable dependent on whether the SoC is mirrored or non-mirrored.

Figure 8:
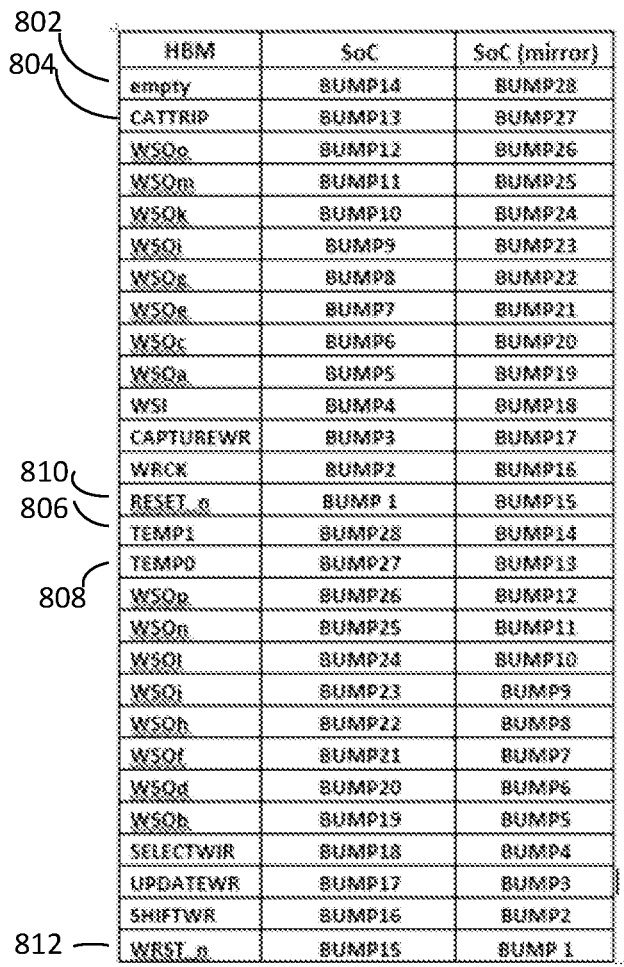
FIG. 8 is a table illustrating the mapping of signals in the mid-stack region of the HBM3 between the HBM3 die and the SoC die (non-mirrored and mirrored) to the bump matrix (Bump1 to Bump27) shown in FIG. 7.

FIG. 8 is a table illustrating the mapping of signals in the mid-stack region 506 of the HBM3 between the HBM3 die and the SoC die (non-mirrored and mirrored) to the bump matrix (Bump1 to Bump27) shown in FIG. 7. The functionality of each bump (Bump1 to Bump27) is dependent on whether the SoC die is mirrored or non-mirrored. Some signals are input signals (for example, TEMP1) to the SoC dies and other signals are output signals (for example, RESET_n) from the SoC die. The bumps on the SoC die are programmable through circuits that are capable of performing either an input operation or an output operation.

A multiplexor network in the SoC die swizzles the incoming signals from the HBM3 die to appropriate internal paths and the outgoing signals to the HBM3 die to the correct bumps.

Proper connectivity between signals on bumps on the HBM3 die and the bumps on the mirrored SoC die is ensured through remapping of special signals such as clocks, strobes, and parity. Special connectivity is required on some signals in the mid-stack region 506 to connect to the mirrored logic die.

Row 802 illustrates the mapping of HBM3 die bump (empty) to bump14 on non-mirrored SoC die and to bump 28 on mirrored SoC die. Bump 28 (row 806) corresponds to HBM3 Temp1 (bit 1 of DRAM Temperature report) which is an output signal from the HBM3 die. In the non-mirrored SoC die, bump 14 is connected to empty (that is there is no signal on the HBM3 die) and I/O circuitry for mirrored mode in the SoC die is bypassed. In the mirrored mode, I/O circuitry in the mirrored SoC is enabled to allow the TEMP1 signal to be output to the HBM3 die.

Row 804 illustrates the mapping of HBM3 die bump (CATRIP) to bump13 on non-mirrored SoC die and to bump 27 on mirrored SoC die. CATRIP (DRAM Catastrophic Temperature Report) is an output signal from the HBM3 die. Bump 27 (row 808) corresponds to HBM3 Temp2 (bit 2 of DRAM Temperature report) which is an input signal.

Row 810 illustrates the mapping of HBM3 die bump (RESET_0) to bump15 on non-mirrored SoC die and to bump 1 on mirrored SoC die. RESET_n is an input signal to the HBM3 die. Bump 1 (row 812) corresponds to HBM3 WRST_n (Wrapper Serial Port Reset) which is an input signal.

The HBM3 on package memory tile supports sixteen memory channels labeled A-P. Each channel provides access to an independent set of Dynamic Random Access Memory (DRAM) banks. Requests from one channel may not access data attached to a different channel.

Each channel in a HBM3 die supports a 64-bit Double Data Rate (DDR) data bus. Pseudo Channel mode divides each channel into two individual 32-bit (2 DWORDS) I/O pseudo-channels. Each channel in a HBM2 die supports a 128-bit Double Data Rate (DDR) data bus. Pseudo Channel mode divides each channel into two individual 64-bit (2 DWORDS) I/O pseudo-channels.

The reconfigurable HBM I/O interface (also referred to as a physical interface (PHY)) in the logic tile allows common routing between the logic tile and the on package memory via an Embedded Multi-die Interconnect Bridge (EMIB), an interposer or a Local Silicon Interconnect (LSI).

Each instance of the HBM I/O interface in the SoC can be configured to a mirror or non-mirror mode. The configuration can be performed in manufacturing using a pin strap that is set to one of two values. No memory controller changes are required.

Figures 9A, 9B:
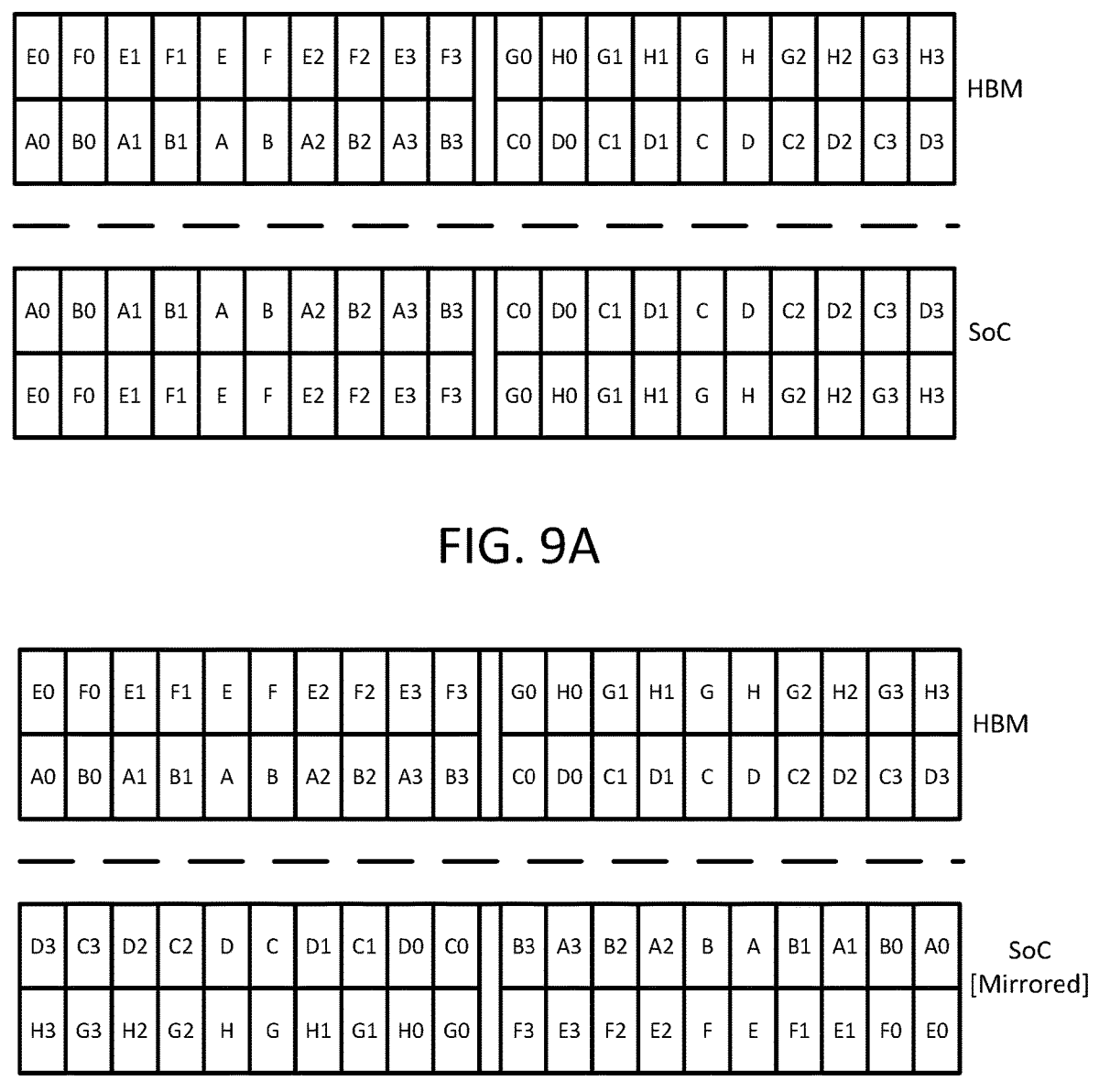

FIG. 9A illustrates a pseudo channel (A-H) bump matrix for a master SoC die and a master HBM2 die. Each channel (A-H) has two pseudo-channels each of which has 32-bits (DWORD). For example, channel A has four DWORDs labeled A3-A0. Lower pseudo channel includes DWORDs labeled A1-A0 and upper pseudo channel includes DWORDs labeled A3-A2.

The two pseudo-channels operate semi-independently. They share the channel's row and column command bus as well as Clock (CK) and Clock Enable (CKE) input signals, but they decode and execute commands individually. Address BA4 directs commands to one of two pseudo channels, an upper pseudo-channel (BA4=0) or a lower pseudo-channel (BA4=1), providing a unique address space to each pseudo-channel.

FIG. 9B illustrates a pseudo channel (A-H) bump matrix for a mirrored SoC tile and a master HBM2 die. Data is sent to the opposite pseudo channel when the tile is mirrored, for example, as shown in FIG. 9B, lower pseudo-channel (A0-A1) of Channel A is connected to upper pseudo-channel (D3-D2) of channel D.

FIG. 10A is a table illustrating the mapping of pseudo channels between the HBM2 die and the SoC die (non-mirrored and mirrored).

In an embodiment, inversion of address bit BA4 (the pseudo channel select bit) is configurable in the command bus by a memory controller in the logic die and the HBM2 I/O interface in the logic die to allow selection of the pseudo channel dependent on whether the logic tile is mirrored or non-mirrored.

BA4 (the Pseudo channel Select bit) has two paths in the memory controller, a first path to read data, a second path is to the HBMIO interface. The BA4 bit is flipped in the mirrored logic tile on only in the second path to connect to the correct Pseudo-channel in the memory die.

FIG. 10B is a table that illustrates a subset of special signals from the mirrored SoC die to the HBM2 die. The routing for these special signals between the mirrored SoC die and the HBM2 die enables a common connectivity (EMIB or LSI) for mirrored SoC die and a non-mirrored SoC die.

Figure 11:
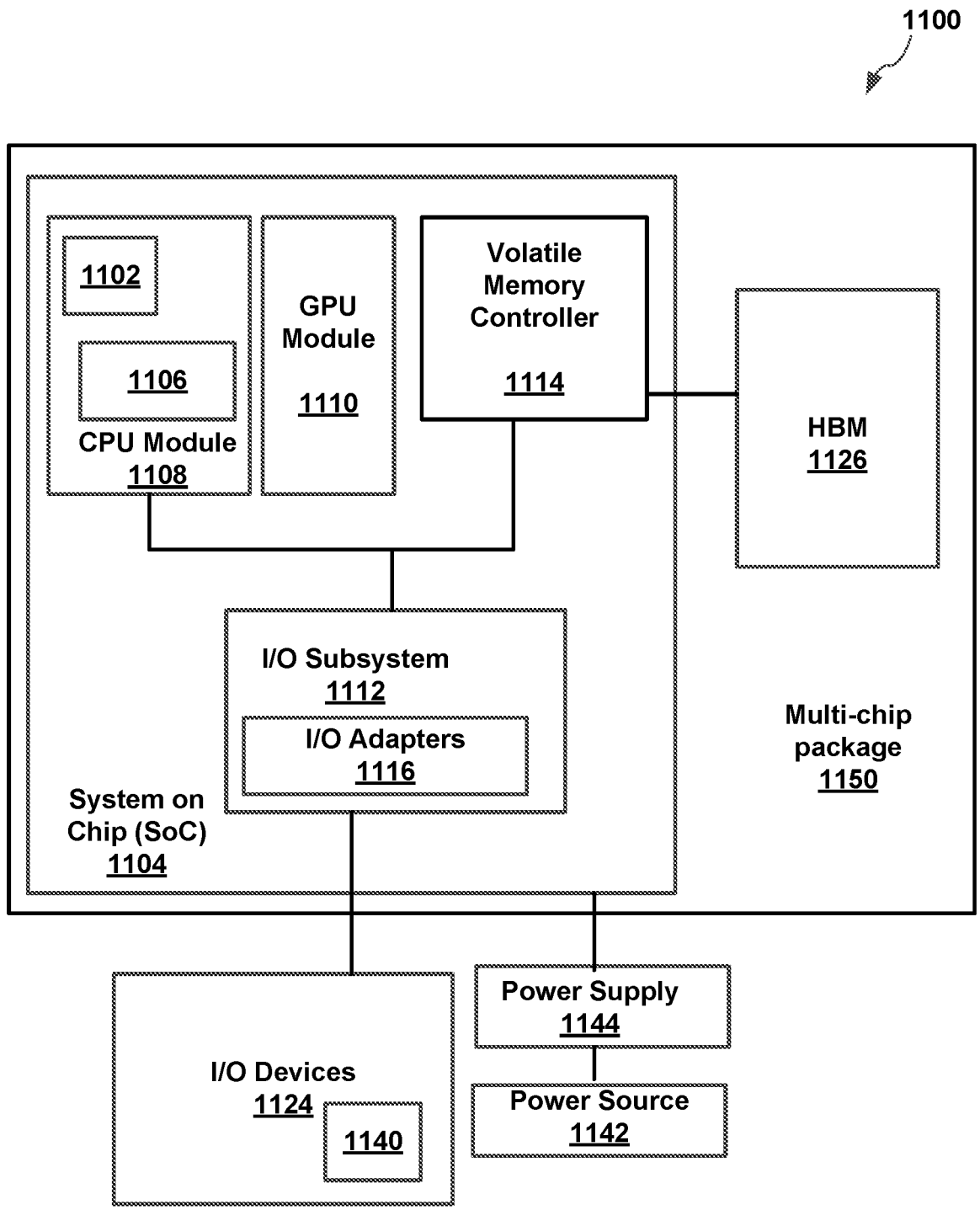
FIG. 11 is a block diagram of an embodiment of a computer system that includes a multi-chip package as shown in FIGS. 1A-1B.

FIG. 11 is a block diagram of an embodiment of a computer system 1100 that includes a multi-chip package 1150 as shown in FIGS. 1A-1B. Computer system 1100 can correspond to a computing device including, but not limited to, a server, a workstation computer, a desktop computer, a laptop computer, and/or a tablet computer.

A system on chip (SOC or SoC) 1104 in the multi-chip package 1150 combines processor, graphics, memory, and Input/Output (I/O) control logic into one SoC package. The SoC 1104 includes at least one Central Processing Unit (CPU) module 1108, a volatile memory controller 1114, and a Graphics Processor Unit (GPU) 1110. The volatile memory controller 1114 is communicatively coupled to HBM 1126 in the multi-chip package 1150. The CPU module 1108 includes at least one processor core 1102 and a level 2 (L2) cache 1106.

Although not shown, each of the processor core(s) 1102 can internally include one or more instruction/data caches, execution units, prefetch buffers, instruction queues, branch address calculation units, instruction decoders, floating point units, retirement units, etc. The CPU module 1108 can correspond to a single core or a multi-core general purpose processor, such as those provided by Intel® Corporation, according to one embodiment.

The Graphics Processor Unit (GPU) 1110 can include one or more GPU cores and a GPU cache which can store graphics related data for the GPU core. The GPU core can internally include one or more execution units and one or more instruction and data caches. Additionally, the Graphics Processor Unit (GPU) 1110 can contain other graphics logic units that are not shown in FIG. 1, such as one or more vertex processing units, rasterization units, media processing units, and codecs.

Within the I/O subsystem 1112, one or more I/O adapter(s) 1116 are present to translate a host communication protocol utilized within the processor core(s) 1102 to a protocol compatible with particular I/O devices. Some of the protocols that adapters can be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 1116 can communicate with external I/O devices 1124 which can include, for example, user interface device(s) including a display and/or a touch-screen display 1140, printer, keypad, keyboard, communication logic, wired and/or wireless, storage device(s) including hard disk drives ("HDD"), solid-state drives ("SSD"), removable storage media, Digital Video Disk (DVD) drive, Compact Disk (CD) drive, Redundant Array of Independent Disks (RAID), tape drive or other storage device. The storage devices can be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (NVM Express) over PCIe (Peripheral Component Interconnect Express), and SATA (Serial ATA (Advanced Technology Attachment)).

Additionally, there can be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

Power source 1142 provides power to the components of system 1100. More specifically, power source 1142 typically interfaces to one or multiple power supplies 1144 in system 1100 to provide power to the components of system 1100. In one example, power supply 1144 includes an AC to DC (alternating current to direct current) adapter to plug into a wall outlet. Such AC power can be renewable energy (e.g., solar power) power source 1142. In one example, power source 1142 includes a DC power source, such as an external AC to DC converter. In one example, power source 1142 or power supply 1144 includes wireless charging hardware to charge via proximity to a charging field. In one example, power source 1142 can include an internal battery or fuel cell source.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope.

Therefore, the illustrations and examples herein should be construed in an illustrative, and not a restrictive sense. The scope of the invention should be measured solely by reference to the claims that follow.

What is claimed is:

1. A multi-chip device comprising:
    a memory die;
    a logic die including a memory controller and a memory interface to connections between the memory die and the logic die;
    a mirrored logic die mirrored along a mirror plane of the logic die, the connections mismatched between the memory die and the mirrored logic die;
    the memory interface to configure the connections between the memory die and the logic die, including to configure mismatched connections between the memory die and the mirrored logic die, using a channel mapping to map a memory die channel bump matrix to respective logic die and mirrored logic die channel bump matrices; and
    the memory controller to route channel signals transmitted on channel bumps between the memory die and the respective logic die and mirrored logic die based on the configured connections and configured mismatched connections.

2. The multi-chip device of claim 1, wherein the memory die is a High Bandwidth Memory die and the logic die is a System on Chip die.

3. The multi-chip device of claim 1, wherein a channel order in a channel bump matrix on the mirrored logic die and the channel order in a channel bump matrix on the memory die are different resulting in one or more of the mismatched connections.

4. The multi-chip device of claim 1, wherein the channel signals include pseudo channel signals, further comprising:
    the memory interface to configure the connections and the mismatched connections using a pseudo channel mapping to map pseudo channels in the memory die channel bump matrix to corresponding pseudo channels in the respective logic die and mirrored logic die channel bump matrices; and
    the memory controller to route the pseudo channel signals transmitted on channel bumps between the memory die and the respective logic die and mirrored logic die based on the configured connections and configured mismatched connections.

5. The multi-chip device of claim 1, further comprising a bridge.

6. The multi-chip device of claim 1, further comprising an interposer.

7. A system comprising:
    a processor; and
    a multi-chip device comprising:
    a memory die,
    a logic die including a memory controller and a memory interface to connections between the memory die and the logic die,
    a mirrored logic die mirrored along a mirror plane of the logic die, the connections mismatched between the memory die and the mirrored logic die,
    the memory interface to configure the connections between the memory die and the logic die, including to configure mismatched connections between the memory die and the mirrored logic die, using a channel mapping to map a memory die channel bump matrix to respective logic die and mirrored logic die channel bump matrices, and
    the memory controller to route channel signals transmitted on channel bumps between the memory die and the respective logic die and mirrored logic die based on the configured connections and configured mismatched connections.

8. The system of claim 7, wherein the memory die is a High Bandwidth Memory die and the logic die is a System on Chip die.

9. The system of claim 7, wherein a channel order in a channel bump matrix on the mirrored logic die and the channel order in a channel bump matrix on the memory die are different resulting in one or more of the mismatched connections.

10. The system of claim 7, wherein the channel signals include pseudo channel signals, further comprising:
    the memory interface to configure the connections and the mismatched connections using a pseudo channel mapping to map pseudo channels in the memory die channel bump matrix to corresponding pseudo channels in the respective logic die and mirrored logic die channel bump matrices; and the memory controller to route the pseudo channel signals transmitted on channel bumps between the memory die and the respective logic die and mirrored logic die based on the configured connections and configured mismatched connections.

11. The system of claim 7, wherein the multi-chip device further comprising a bridge.

12. The system of claim 7, wherein the multi-chip device further comprising an interposer.

13. The system of claim 7, further comprising one or more of:
a display communicatively coupled to the processor; or
a battery coupled to the processor.

14. A method comprising:
in a multi-chip device including:
a memory die and a logic die, the logic die including a memory controller and a memory interface to connections between the memory die and the logic die, and
a mirrored logic die mirrored along a mirror plane of the logic die, the connections mismatched between the memory die and the mirrored logic die;
the memory interface configuring the connections between the memory die and the logic die and mismatched connections between the memory die and the mirrored logic die, including mapping a memory die channel bump matrix to respective logic die and mirrored logic die channel bump matrices using a channel mapping; and the memory controller routing channel signals transmitted on channel bumps between the memory die and the respective logic die and mirrored logic die according to the configured connections and configured mismatched connections.

15. The method of claim 14, wherein the memory die is a High Bandwidth Memory die and the logic die is a System on Chip die.

16. The method of claim 14, wherein a channel order in a channel bump matrix on the mirrored logic die and the channel order in a channel bump matrix on the memory die are different resulting in one or more of the mismatched connections.

17. The method of claim 14, wherein the channel signals include pseudo channel signals, further comprising:
the memory interface configuring the connections and the mismatched connections, including mapping pseudo channels in the memory die channel bump matrix to corresponding pseudo channels in the respective logic die and mirrored logic die channel bump matrices using a pseudo channel mapping; and the memory controller routing the pseudo channel signals transmitted on channel bumps between the memory die and the respective logic die and mirrored logic die according to the configured connections and configured mismatched connections.

18. The method of claim 14, wherein the multi-chip device further comprises any of a bridge and an interposer.

* * * * *